US006316281B1

(12) United States Patent
Lee et al.

(10) Patent No.: US 6,316,281 B1
(45) Date of Patent: Nov. 13, 2001

(54) METHOD FOR FABRICATING A HYBRID OPTICAL INTEGRATED CIRCUIT EMPLOYING SOI OPTICAL WAVEGUIDE

(75) Inventors: Sang Hwan Lee; Gwan Chong Joo; Nam Hwang; Min Kyu Song, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/393,279

(22) Filed: Sep. 10, 1999

(30) Foreign Application Priority Data

Sep. 12, 1998 (KR) .................................. 98-37714

(51) Int. Cl.[7] .............................. H01L 21/00; G02B 6/42
(52) U.S. Cl. .................................. 438/31; 385/14; 385/49
(58) Field of Search .................................. 438/29, 31, 39, 438/40, 42, 43; 385/4, 14, 15, 49

(56) References Cited

U.S. PATENT DOCUMENTS

| 4,639,074 | | 1/1987 | Murphy .................................. 385/14 |
| 4,735,677 | | 4/1988 | Kawachi et al. ........................ 438/25 |
| 4,877,299 | * | 10/1989 | Lorenzo et al. ......................... 385/3 |
| 5,641,612 | * | 6/1997 | Lee et al. ............................... 430/321 |
| 5,703,973 | | 12/1997 | Mettler et al. .......................... 385/49 |
| 5,757,986 | * | 5/1998 | Crampton et al. ....................... 385/2 |
| 5,787,214 | * | 7/1998 | Harpin et al. ........................... 385/49 |
| 5,854,867 | * | 12/1998 | Lee et al. ............................... 385/49 |
| 5,881,190 | * | 3/1999 | Harpin et al. ........................... 385/49 |
| 6,058,234 | * | 5/2000 | Tachigori .............................. 385/49 |
| 6,063,299 | * | 5/2000 | Drake et al. ........................... 216/24 |
| 6,101,210 | * | 8/2000 | Bestwick et al. ....................... 372/96 |

(List continued on next page.)

OTHER PUBLICATIONS

J. Schmidtchen et al., Low–Loss Single mode Optical Waveguides with Large Cross–section in Silcon –on–Insulator. 1991 IEEE, pp. 1486–1488.*
U. Fischer et al., 0.1db/cm Waveguide Losses in Single–Mode SOI Rib Waveguides. 1996 IEEE, pp. 647–648.*
R. Emmons et al., Buried–Oxide Silicon–on–Insulator Structures I: Optical Waveguide Charateristics. 1992 IEEE, pp. 157–163.*
C.K. Tang et al., Development of a Library of Low–Loss Silicon–on–Insulator Optoelectronic Devices. 1996 IEEE, pp. 312–315.*
M. Rosa et al., Self–Alignment of Optical Fibers with Optical Quality End–Polished Silicon Rib Waveguides Using Wet Chemical Micromachining Techniques. 1999 IEEE, pp. 1249–1254.*

(List continued on next page.)

Primary Examiner—Olik Chaudhuri
Assistant Examiner—Anh Duy Mai
(74) Attorney, Agent, or Firm—Jacobson Holman, PLLC

(57) ABSTRACT

The present invention relates to an optical integrated circuit; and, more particularly, to a method for preparing an improved hybrid optical integrated circuit which is capable of accommodating optical waveguides, optical devices, such as light emitting devices and light receiving devices, and optical fibers in an effective manner. The present invention has the advantages of minimizing horizontal misalignment error between the SOI waveguide rib area, the V-groove etch window and the alignment marks, decreasing the manufacturing cost by passively aligning the waveguides, the optical devices and the optical fibers on a single substrate. Also, the present invention has an effect of reducing fresnel reflection loss by providing the LPCVD silicon nitride layer capable of being used as an anti-reflection coating layer at both ends of the waveguide.

11 Claims, 17 Drawing Sheets

U.S. PATENT DOCUMENTS

| | | | |
|---|---|---|---|
| 6,108,478 | * 8/2000 | Harpin et al. | 385/129 |
| 6,157,759 | * 12/2000 | Seo et al. | 385/49 |
| 6,163,632 | * 12/2000 | Rickman et al. | 385/14 |
| 6,217,232 | * 4/2001 | Duesman et al. | 385/88 |
| 6,222,951 | * 4/2001 | Huang | 385/14 |
| 6,231,771 | * 5/2001 | Drake | 216/14 |

OTHER PUBLICATIONS

V.P. Kesan et al., Integrated Waveguide–Photodector Using Si/SiGe Multiple Quantum Wells for Long Wavelength Applications. 1990 IEEE, pp. 637–640.*

H. Nishihara et al., Recent Advancement on Optical Integrated Circuits. 1990 IEEE, pp. 99–103.*

B. Schuppert et al., Integrated Optics in Silicon and SiGe–Heterostructures. 1996 IEEE, pp. 2311–2323.*

C.H. Henry et al., "Glass Waveguides on Silicon for Hybrid Optical Packaging", Journal of Lightwave Technology, vol. 7, No. 10, Oct. 1989, pp. 1530–1539.

Tim Bestwick, "ASOC[198] —A Silicon–Based Integrated Optical Manufacturing Technology", 1998 IEEE.

A.G. Rickman et al., "Silicon–on–Insulator Optical Rib Waveguide Loss and Mode Characteristics", Journal of Lightwave Technology, vol. 12, No. 10, Oct. 1994, pp. 1771–1776.

C.A. Jones et al. "Hybrid Integration of Optical and Electronic Components on a Silicon Motherboard", pp. 273–274.

* cited by examiner

METHOD FOR FABRICATING A HYBRID OPTICAL INTEGRATED CIRCUIT EMPLOYING SOI OPTICAL WAVEGUIDE

BACKGROUND OF THE INVENTION

1. Field of the Invention

The present invention relates to an optical integrated circuit; and, more particularly, to a method for preparing an improved hybrid optical integrated circuit which is capable of accommodating optical waveguides, optical devices, such as light emitting devices or light receiving devices, and optical fibers in an effective manner.

2. Description of the Prior Art

As the amount of information has been dramatically increased in a modern society, in order to transmit such great amount of the information, an optical integrated circuit has been suggested as a core technique in view of the performance and price for an optical transmission system. Such an optical integrated circuit includes two types: optoelectronic integrated circuit(OEIC); and a hybrid integrated circuit (HIC). In the OEIC, an optical waveguide, a light emitting device and a light receiving device are prepared by using the same material and optically coupled to each other on a monolithic wafer which is made of a compound semiconductor, for example, InP. While, in the HIC, a light emitting device and a light receiving device are combined on a wafer by using a surface mounting technique. In view of the conventional techniques, the HIC is more realistic to be implemented than the OEIC.

Various efforts have been addressed to prepare a hybrid optical integrated circuit in which an active optical devices, such as a light emitting device and a light receiving device, are mounted on a wafer together with an optical waveguide. Referring to FIG. 1, there is shown a hybrid optical integrated circuit described in U.S. Pat. No. 4,735,677, issued to Masao Kawachi et al, entitled "Method for fabricating hybrid optical integrated circuit." As shown in FIG. 1, the hybrid optical integrated circuit includes a high-silica glass optical waveguide 141 formed on a silicon substrate 140, a semiconductor laser 147 as a light emitting device, a semiconductor photodetector 148 as a light receiving device, guides 142 for aligning the semiconductor laser 147, guides 143 for aligning optical fibers 149. The high-silica optical waveguide 141 has a Y-branch shape which defines three end faces 144 to 146. The semiconductor laser 147 is positioned between the guides 142 on the silicon substrate 140 and coupled to a first end face 144. The photodetector 148 is mounted on the silicon substrate 140 and coupled to a second end face 145. The optical fiber 149 is located between the guides 143 and coupled to a third end face 146.

The optical waveguide 141 is generally integrated on the silicon substrate 140 and the semiconductor laser 147 and the optical fiber 149 are aligned to the first and third end faces 144 and 146 of the optical waveguide 141 by using the semiconductor laser alignment guides 142 and the optical fiber alignment guides 143, respectively. Usually, high silica optical waveguide 141 should have a thickness of several tens of microns to meet a single mode condition. In this case, the etching process for fully defining or forming the optical waveguide 141 significantly attacks the etching mask layer also so that the dimension of the optical waveguide 141 and alignment guides 142 and 143 may be altered in micron range. Furthermore, the semiconductor laser 147 should have to machined with submicron accuracy in order to be precisely aligned by the semiconductor laser alignment guides 142, while it is so difficult to treat a compound semiconductor material, for example, InP, GaAs or the like, used in fabricating the semiconductor laser 147 in a submicron-level precision due to the brittleness thereof.

The waveguide device used for transmitting light within optical devices and optical integrated circuits must have a low light transmission loss and a comparable mode size with optical devices to be interconnected with thereof. In some cases, it should have electro-optic or thermo-electric effects, in order to implement passive and active waveguide devices.

Since single crystal silicon widely used in semiconductor integrated circuit have a higher transmittance in a wavelength range of 1.2 to 1.6 micron, it is possible to use the silicon layers as an optical waveguide in the above wavelength range. FIG. 2 shows a cross-sectional view illustrating a conventional rib-type SOI (Silicon On Insulator) optical waveguide which is typically formed on a SOI wafer. The SOI wafer has been fabricated by the silicon direct bonding or the separation by implantation of oxygen (SIMOS) methods. The SOI waveguide structure includes a buffer layer 151 formed on a silicon substrate 150, a core layer 152 and a cladding layer 153. Typically, the buffer layer 151 formed at a thickness of 1 to 2 $\mu$m has been made of a silicon oxide layer. The core layer 152 has been made of a single crystal silicon layer having a thickness of 2 to 10 $\mu$m. And a silicon oxide layer formed by oxidizing the surface of the core layer 152 is used as the cladding layer 153. In order that light is guided within the core layer 152 of the SOI waveguide and satisfies a single mode condition in the vertical and horizontal directions, the width (W) 155 of a rib, the height (H) of the core layer 157 and the height (rH) 154 of a slab are given by:

$$r \leq 0.5$$

$$\frac{H}{W} \leq 0.3 + \frac{r}{\sqrt{1-r^2}}$$

Accordingly, to obtain the maximum optical coupling efficiency when the SOI waveguide is coupled to the laser and the optical fiber, the thickness 157 of the core layer 152, the width 155 of the rib and the height 156 of the rib should be controlled under the condition of satisfying the above equation.

As an example of conventional hybrid optical integrated circuits using the SOI waveguides, FIG. 3 shows an alignment between a waveguide and a laser("ASOC™-A silicon-based integrated optical manufacturing technology," Tim Bestwick et al, Proceedings of the 48th ECTC, 1998, pp 566–571). As shown in FIG. 3, a rib-type SOI waveguide 162 is formed by etching an undesired portion of a single crystal silicon layer 164 which is isolated from a silicon substrate by a buried oxide layer 163 and a laser 161 coupled to the SOI waveguide 162 is mounted on a recess 168 formed when the single crystal silicon layer 164 is etched to form the rib. Accordingly, a guide for aligning the laser 161 to the SOI waveguide 162 is made of a single crystal silicon thin film and a horizontal alignment between the laser 161 and the SOI waveguide 162 is achieved by attaching the laser 161 to both sidewalls 166 and 169 of the recess 168.

As the prior art employing a silica waveguide, the above-mentioned optical integrated circuit using a waveguide thin film as mechanical stops of optical devices, still has had a problem itself in that semiconductor laser is to be mechanically processed. Since SOI waveguide thin film, the thickness of which is only about 10 $\mu$m, cannot be used as an alignment guide of an optical fiber, the thickness of which is about 125 $\mu$m. As the same as the prior art using a silica waveguide, any optical fiber aligner except for the SOI waveguide thin film such as anisotropically etched silicon V-groove is necessary. However, in the case of making a structure for optical fiber alignment by other means but SOI waveguide thin film, a lot of optical coupling loss may be caused between the optical fiber and the waveguide due to the misalignment therebetween.

A shortcoming of a SOI waveguide is that a lot of Fresnel loss may occur in the front and back facet of the SOI waveguide when light is incident from the atmosphere to the SOI waveguide or radiated from SOI waveguide to the atmosphere because a refractive index of the silicon layer (about 3.5) used as a core material is much larger than that of the atmosphere (1). It is necessary to form anti-reflection film in the front and back facet of the waveguide in order to lessen Fresnel loss. It is desirable that the most appropriate anti-reflection film has a refractive index of 1.87 and its thickness has $n\lambda/4$ (n: integer) of the wavelength in the material.

FIG. 4 is a cross-sectional view illustrating an optical coupling between a SOI waveguide and a surface receiving optic detector and forming an anti-reflection film. An optical integrated circuit in FIG. 4 includes the steps of; forming a mirror facet 172 of about 54 angles of inclination to the surface of substrate by etching a single crystal silicon layer 177 of location opposite to a SOI waveguide 170; forming an aluminum reflection film 171 on the mirror facet 172; and commonly forming anti-reflection film 173 on the waveguide's sidewall 175 and the aluminum reflection film 171. At this time, incident light 176 propagating in parallel to the surface of the substrate, emitted from the waveguide 170, is reflected on the aluminum reflection film 171 and then enters into an optic detector 174 mounted over the single crystal silicon layer 177. In this art, there is a tendency of preventing the Fresnel loss in the waveguide facet 175 and mirror facet 172 by simultaneously forming the anti-reflection film 173 on the mirror facet 172 coated with the aluminum reflection film 171 between the mirror facet 172 and the waveguide facet 175. However, the formation of the anti-reflection film 173 is carried out after the deposition of aluminum 171. Therefore, there are such problems that the anti-reflection film must be formed at a temperature below 400° C. so that a metal layer such as an aluminum layer may not be damaged. Accordingly, such a good anti-reflection film as formed at a temperature higher than 600° C., such as LPCVD (low pressure chemical vapor deposition) silicon nitride layer having a refractive index of about 2 which is useful for an anti-reflection film, cannot be used.

There is a problem in a hybrid optical integrated circuit using a silica waveguide and a SOI waveguide in the prior art that the optical device itself must be precisely processed in order to align the optical device to an optical device alignment guide comprised of a waveguide thin film itself. As described above, the waveguide thin film itself cannot be used as the optical fiber alignment guide in the prior art for manufacturing the hybrid optical integrated circuit using the SOI waveguide. Under such a reason, it has been necessary to form such a special optical fiber alignment guide as an anisotropically etched silicon V-groove and at this time, a misalignment between the optical fiber alignment guide and the waveguide and a difficulty in forming the anti-reflection film appropriate for the SOI waveguide may occur.

SUMMARY OF THE INVENTION

It is, therefore, an object of the invention to provide a method for manufacturing a hybrid optical integrated circuit minimizing a registration error between a rib region of a SOI waveguide, optical device alignment marks and an optical fiber alignment V-groove pattern.

It is another object of the invention to provide a method for manufacturing a hybrid optical integrated circuit substrate having an anti-reflection film optimized on SOI waveguide facet, not having an adverse influence on other optical devices.

In accordance with one aspect of the present invention, there is provided a method for fabricating a hybrid optical integrated circuit, the method comprising the steps of: a) providing a SOI wafer including a silicon substrate, a buried insulating layer and a single crystal silicon layer; b) selectively etching the single crystal silicon layer, thereby forming a SOI slab; c) forming a silicon nitride layer and an etching mask layer on the resulting structure, wherein the silicon nitride layer is formed by a low pressure chemical vapor deposition process; d) selectively etching the etching mask layer and the silicon nitride layer to expose the single crystal silicon layer in the SOI slab except a rib area and simultaneously forming a V-groove etch window for aligning an optical fiber and marks for aligning an optical device, wherein the a rib region in the SOI slab is covered with the silicon nitride layer and the etching mask layer; e) selectively etching the exposed single crystal silicon layer to form a SOI rib; f) selectively etching the etching mask layer and the silicon nitride layer on the SOI rib; g) forming a cladding layer for an optical waveguide on a surface of the SOI slab and the SOI rib; h) anisotropically etching the silicon substrate exposed through the V-groove etch window to form an optical fiber guiding V-groove; and i) selectively removing the etching mask layer positioned at both end facets of the SOI slab and exposing the silicon nitride layer.

In this invention, the registration error between a rib region of a SOI waveguide, optical device alignment marks and an optical fiber guiding V-groove etching pattern may be minimized by forming them in self-aligned manner. That is, it will be possible to obtain a high efficiency optical coupling because an alignment precision among an optical fiber guiding V-groove, a SOI waveguide and optical device alignment marks is superior.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
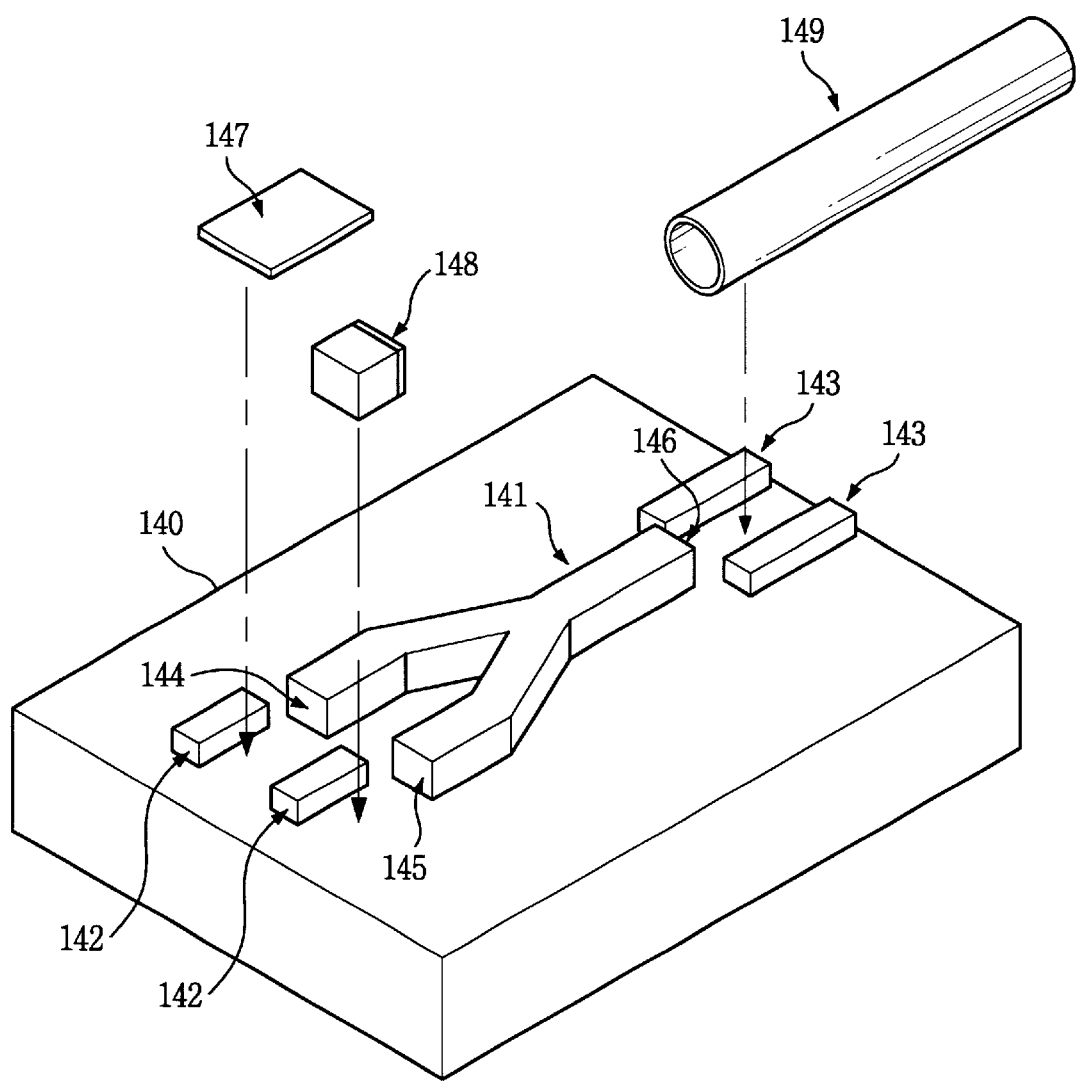
FIG. 1 is a perspective view illustrating a conventional hybrid optical integrated circuit.
Figure 2:
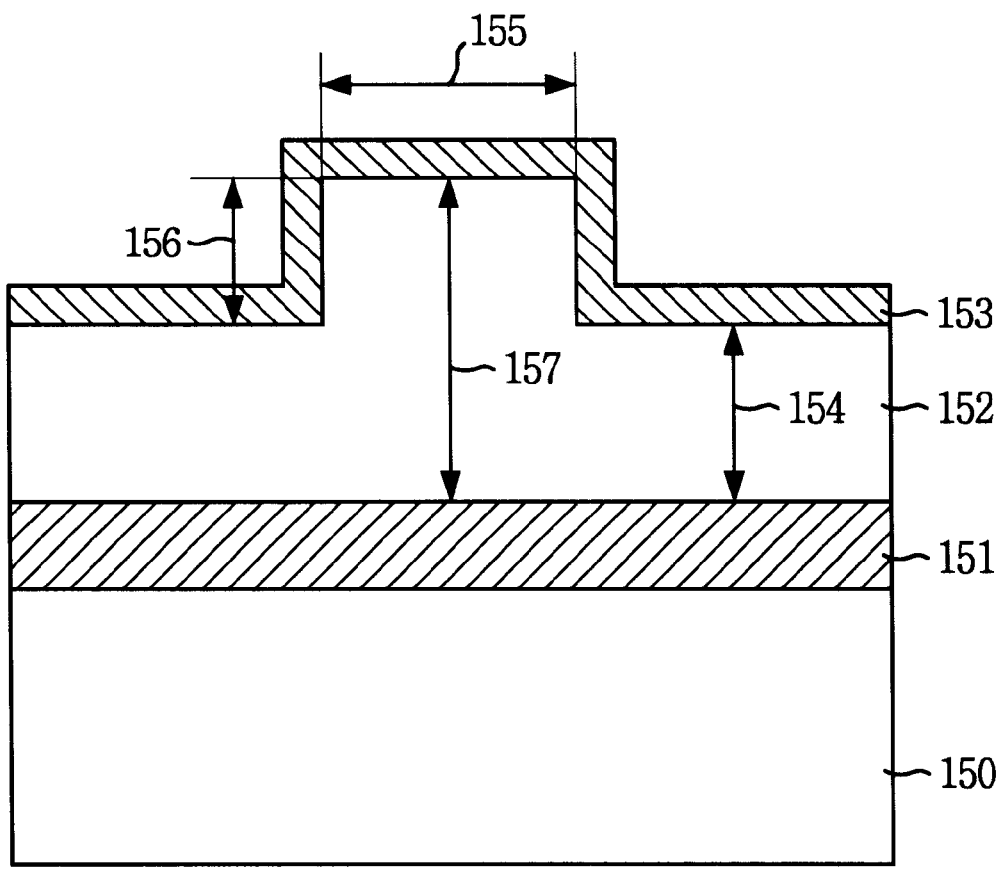
FIG. 2 is a cross-sectional view illustrating a conventional SOI waveguide.
Figure 3:
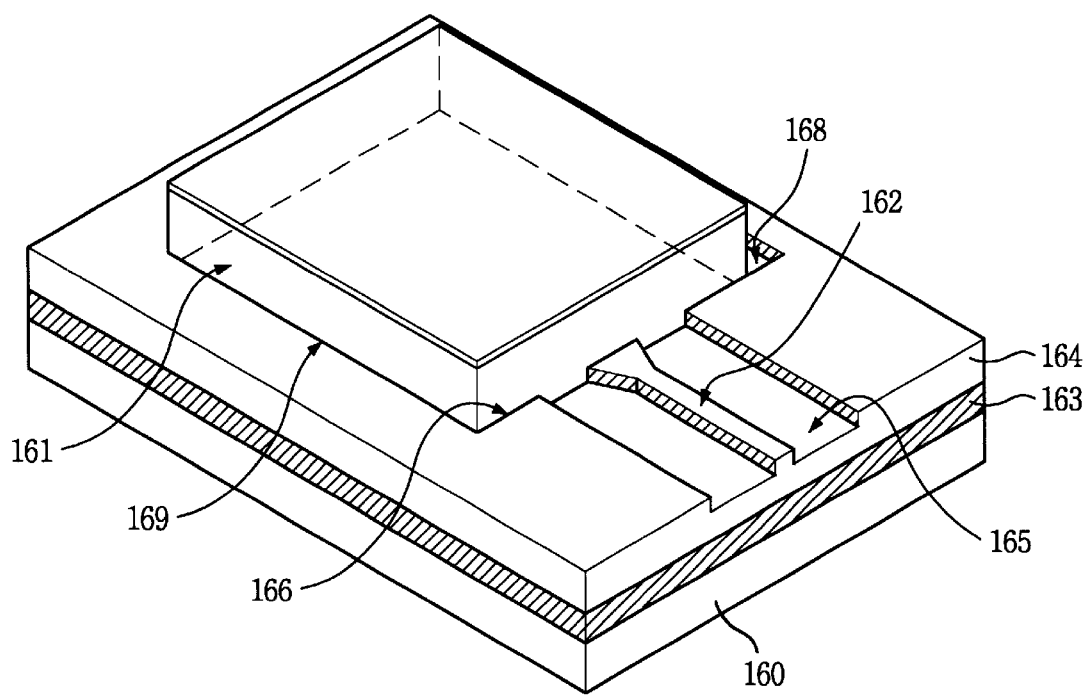
FIGS. 3 and 4 are perspective views illustrating an alignment of a waveguide and a semiconductor laser in the conventional hybrid optical integrated circuit.
Figure 4:
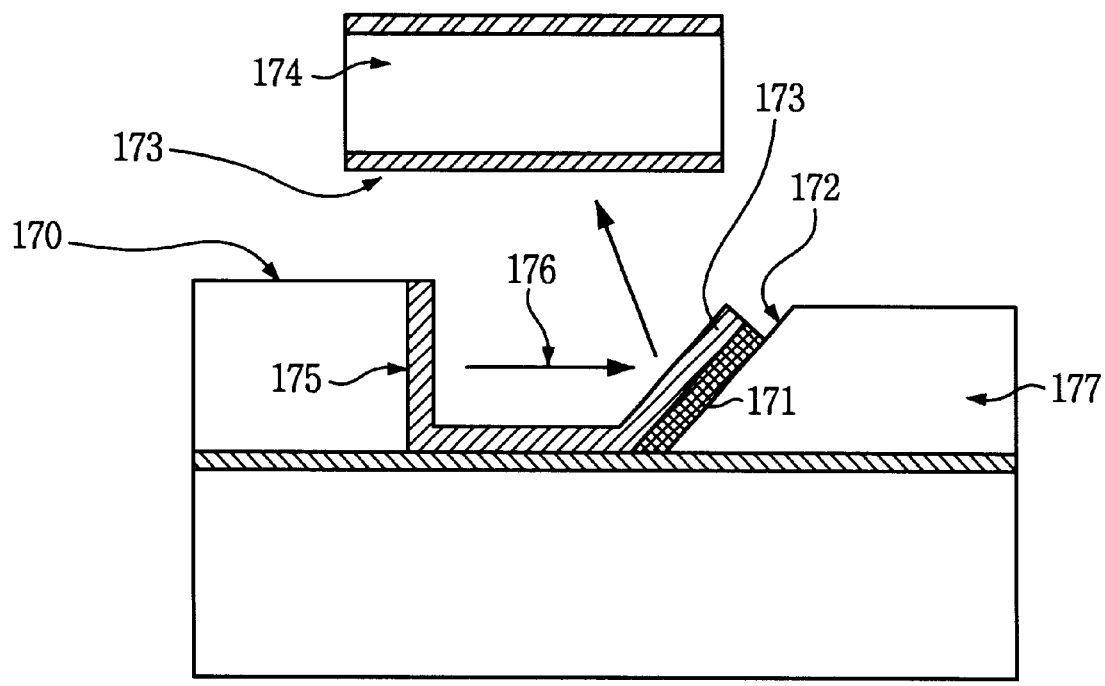
Figure 5:
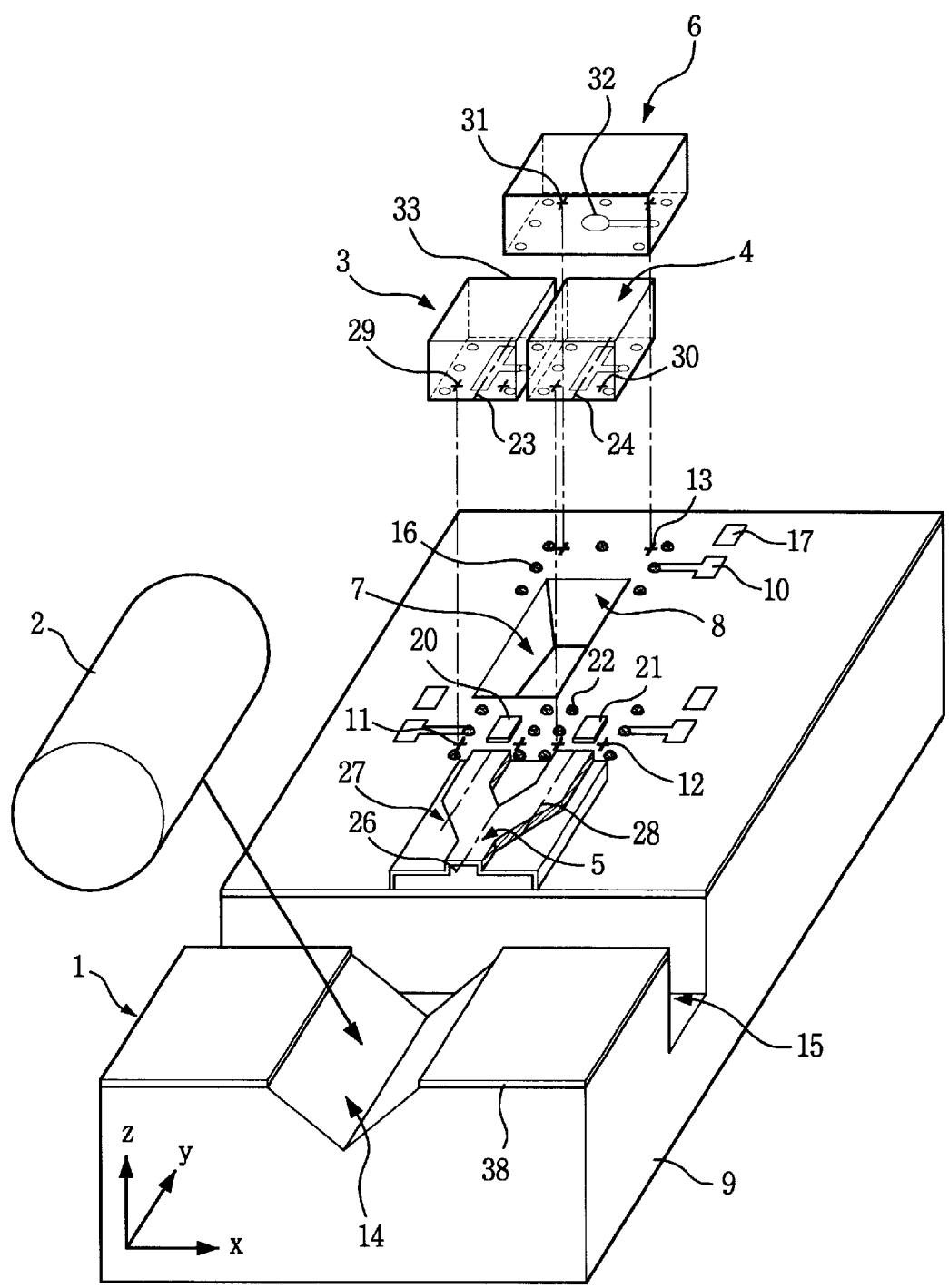
FIG. 5 is a perspective view illustrating a hybrid optical integrated circuit for bi-directional communications according to an embodiment of the present invention.

Referring to FIG. 5, there is shown a hybrid optical integrated circuit according to an embodiment of the present invention. FIG. 5 shows the structure of an optical integrated substrate 1 and an alignment of an edge emitting type semiconductor laser 3 which is used as a light transmitting source on the optical integrated substrate 1, a monitor photodetector 6 for monitoring the semiconductor laser 3, a receiver photodetector 4 of a waveguide type and an optical fiber 2.

As shown in FIG. 5, the hybrid optical integrated circuit includes: a silicon substrate 9 protected by a surface insulating layer 38; a SOI waveguide 5 formed on the silicon substrate 9; semiconductor laser alignment marks 11, monitor photodetector alignment marks 13; a light guide V-groove 7 for transmitting light emitted from backside of the semiconductor laser 3 to the monitor photodetector 6 of a surface light receiving type; receiver photodetector alignment marks 12; an optical fiber alignment V-groove 14 for aligning optical fibers to the SOI waveguide 5; and a trench 15, which is formed at an edge of the guiding V-groove by a blind saw cut, for eliminating the sidewall of the guiding groove. Also, a Y-branch type SOI waveguide 5, which is preferably composed of the Mach-Zehnder interferometer and an optical filter, effectively performs a wavelength division multiplexing capable of transmitting and receiving light through one optical fiber. The optical fiber 2 to transmit and receive light is fixed by an UV curable epoxy or an index matching oil to the guiding V-groove 14 which is aligned to the optical axis of the SOI waveguide 5. The optical fiber 2 can be covered with a silicon substrate having another V-groove.

As a method for attaching the semiconductor laser 3 and the receiver 4 and monitor photodetector 6 to the silicon substrate 9, the die bonding method or the flip chip bonding method (L. F. Miller, "Controlled Collapse Chip Connection," IBM J Res Dev 13, pp. 239–250, 1996) can be used. The present invention uses the flip chip bonding method providing a high precision in the alignment of the hybrid optical integrated circuit.

After the optical axis 23 of the semiconductor laser 3 is aligned to that (reference numeral 27 in FIG. 5) of the waveguide by the alignment marks 11 on the silicon substrate 9 and the alignment marks 29 on the surface of the semiconductor laser 3, the semiconductor laser 3 is attached to the silicon substrate 9 by the flip chip bonding method using solder bumps 22. Also, after the optical axis 24 and 28 of the receiver photodetector 4 and the waveguide 5 are aligned by the alignment marks 12 on the silicon substrate 9 and the alignment marks 30 on the receiver photodetector 4, respectively, the receiver photodetector 4 for receiving light from optical fiber is attached to the substrate 9 by the flip chip bonding method.

The height of each of the semiconductor laser 3 and the receiver photodetector 4 from the surface of the substrate 9 is determined by stand-offs 20 and 21, irrespective of solder bumps 22 for the flip chip bonding. In some cases, the height of the optical devices can be controlled by the solder bumps 22 for the flip chip bonding, thereby removing the need of the stand-offs 20 and 21.

The monitor photodetector 6 is mounted over the light guide V-groove 7 by the flip chip bonding. At this time, the sidewall of the light guide V-groove 7 acts as a turning mirror that reflects a beam that is emitted from the back facet of the semiconductor laser 3 into the light receiving area of the monitor photodetector 6. In case where a photodetector of an edge receiving type is used instead of such a surface receiving monitor photodetector 6, the semiconductor laser 3 may be optically coupled to the edge receiving type photodetector in similar manner to the receiver photodetector 4. An electrical connection for driving the semiconductor laser 3 and the receiver and monitor photodetectors 4 and 6 is implemented by the wire bonding pad 10 directly connected to the solder bumps and an isolated metal pad 17 connected to the optical devices by wire bonding.

Figure 6:
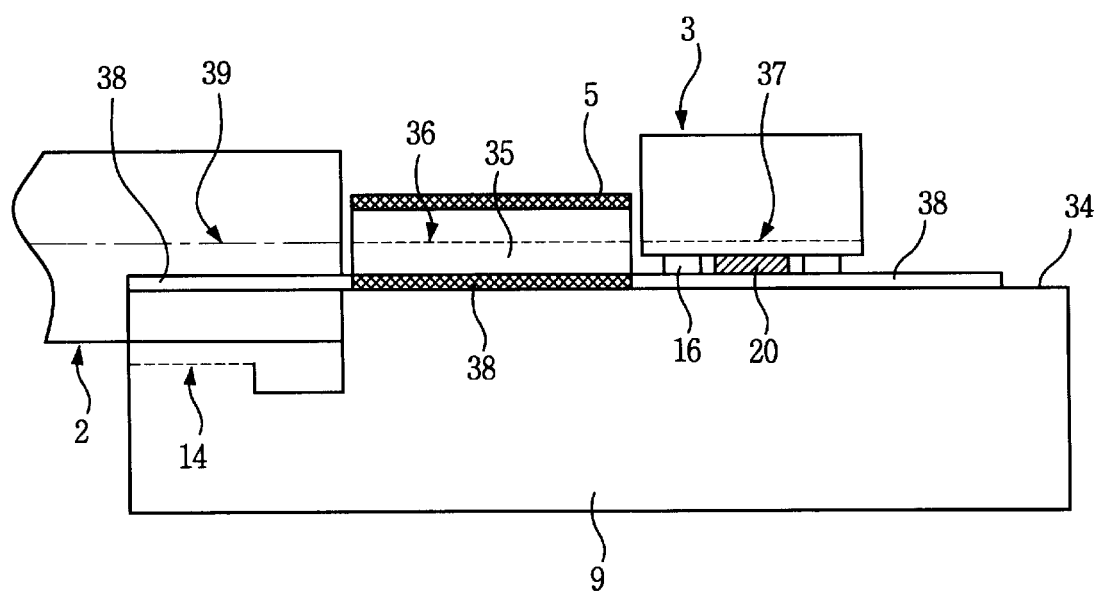
FIG. 6 is a cross-sectional view illustrating the hybrid optical integrated circuit in FIG. 5.

Referring to FIG. 6, there are shown the cross-sectional view of the optical fiber 2, the SOI waveguide 5 and the semiconductor laser 3 on the silicon substrate 9. The optical axis height of the SOI waveguide 5 including buffer layer 35, the thickness of the surface insulating layer 38 and the height of the stand-off 20 under the semiconductor layer 3 are adjusted to automatically align the optical axis 36, 39 and 37 of the SOI waveguide 5, the optical fiber and the semiconductor laser on the silicon surface 34, respectively. Furthermore, the width of the V-groove 14 is determined in order that the height of optical axis of the fiber 39 is the same with that of the SOI waveguide 36 when the optical fiber 2 is mounted on the optical fiber guiding V-groove 14.

Figure 7A:
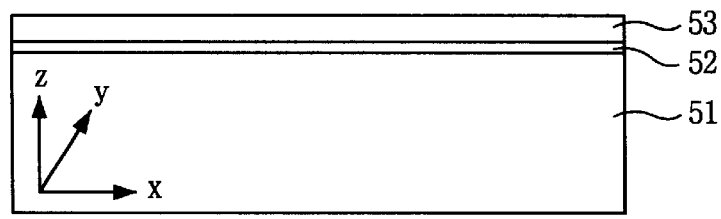
FIGS. 7A to 7Q are views illustrating a method for fabricating the hybrid optical integrated circuit in FIG. 5.
Figure 7B:
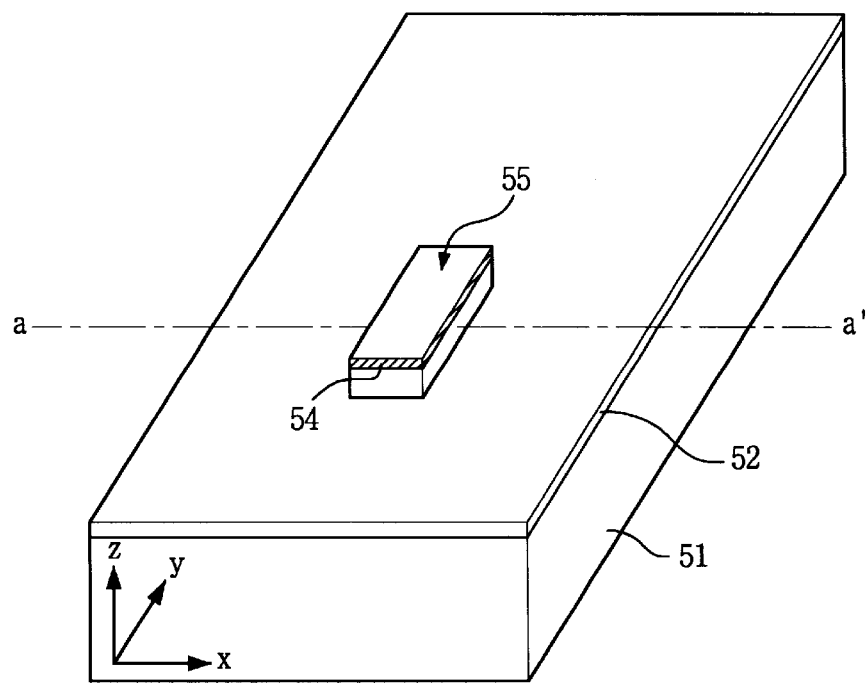
Figure 7C:
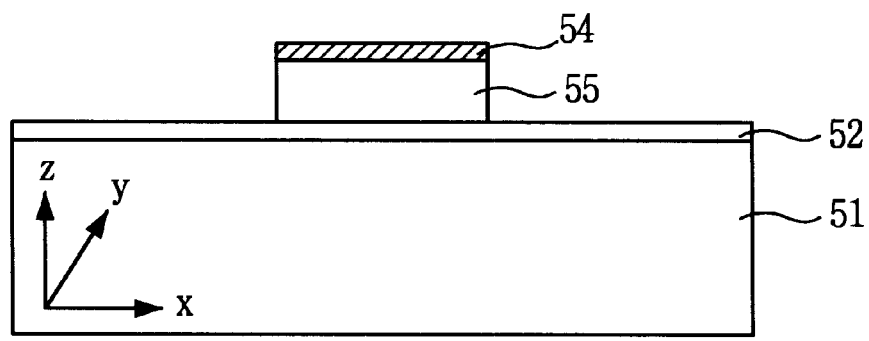
Figure 7D:
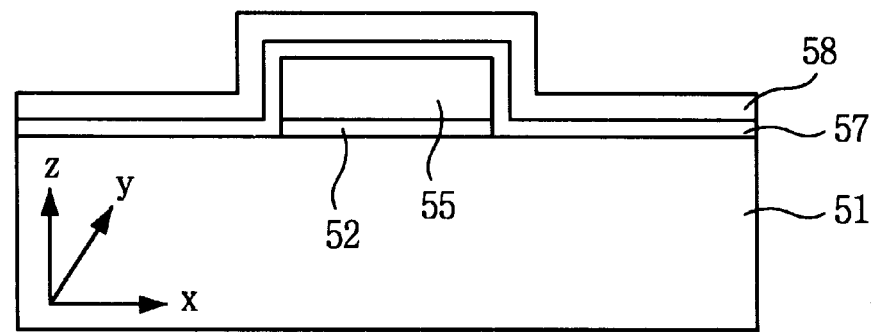
Figure 7E:
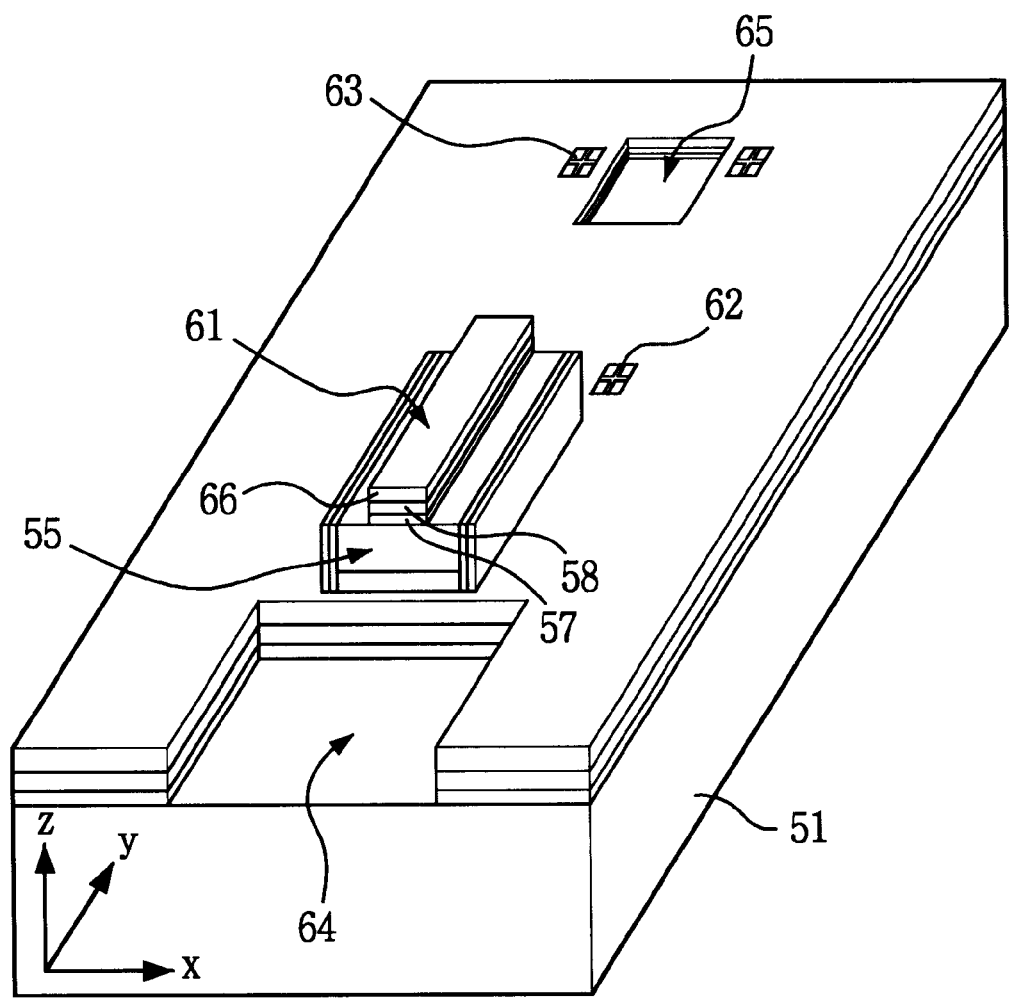
Figure 7F:
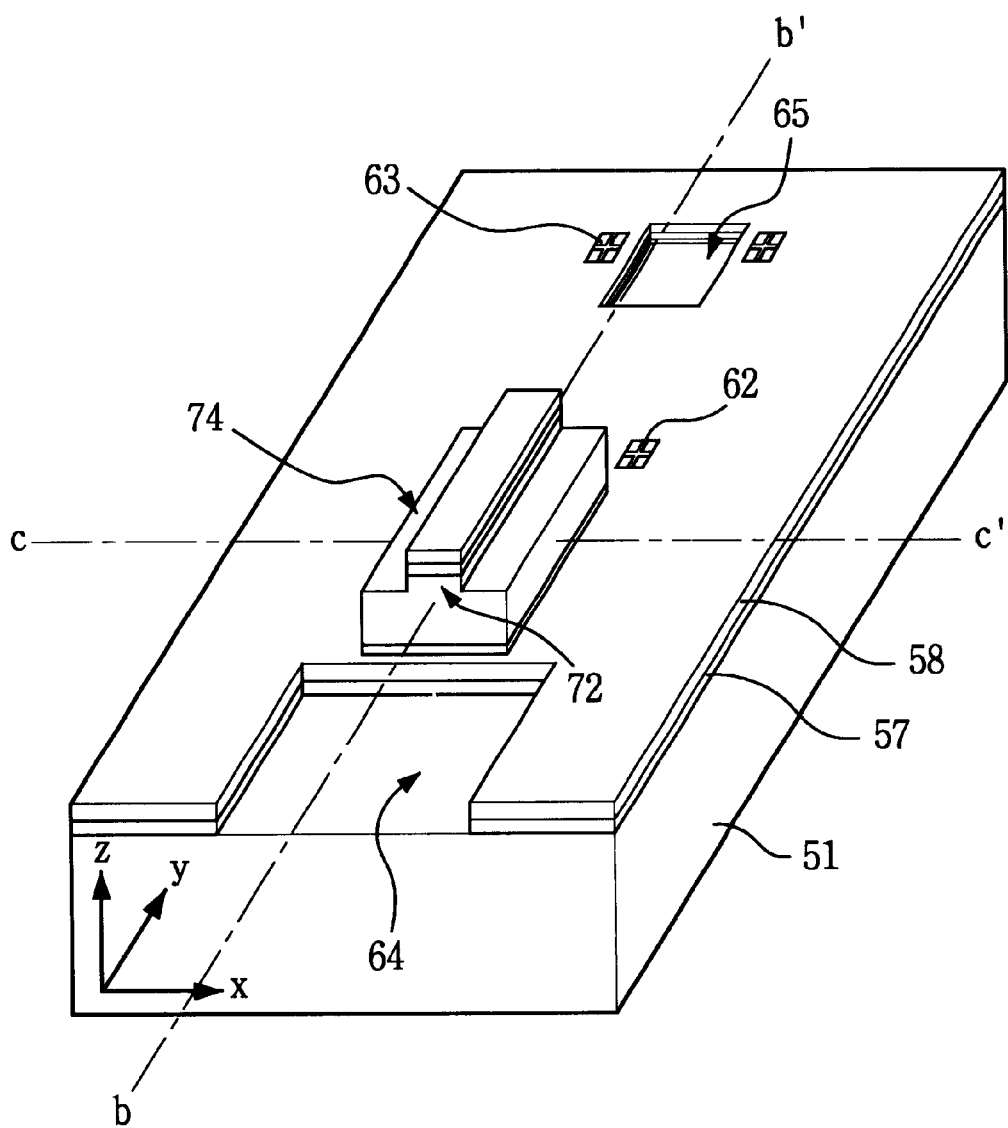
Figure 7G:
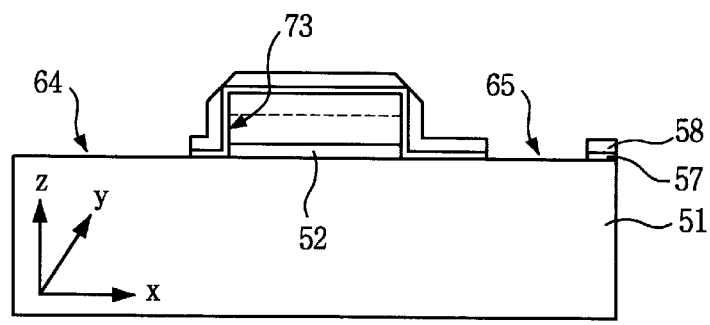
Figure 7H:
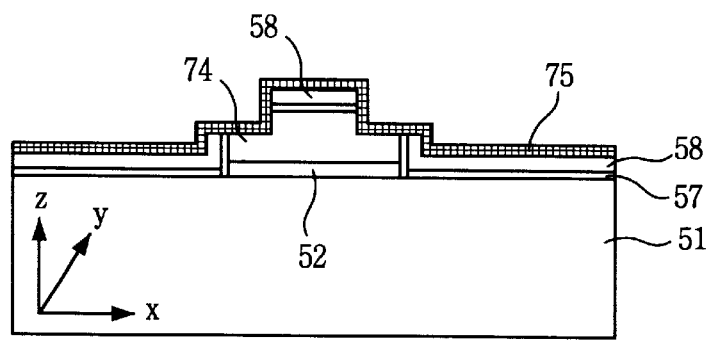
Figure 7I:
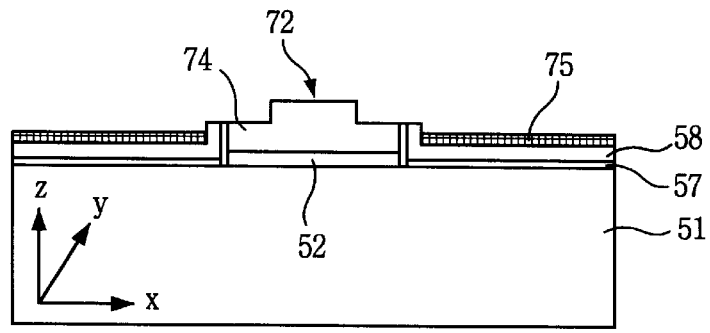
Figure 7J:
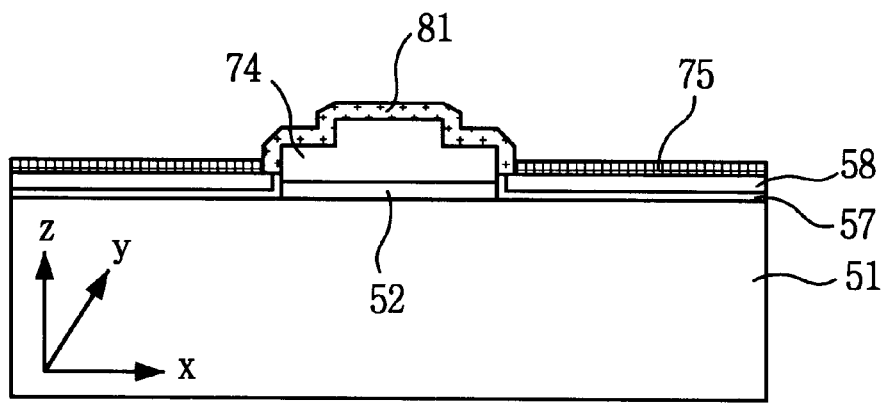
Figure 7K:
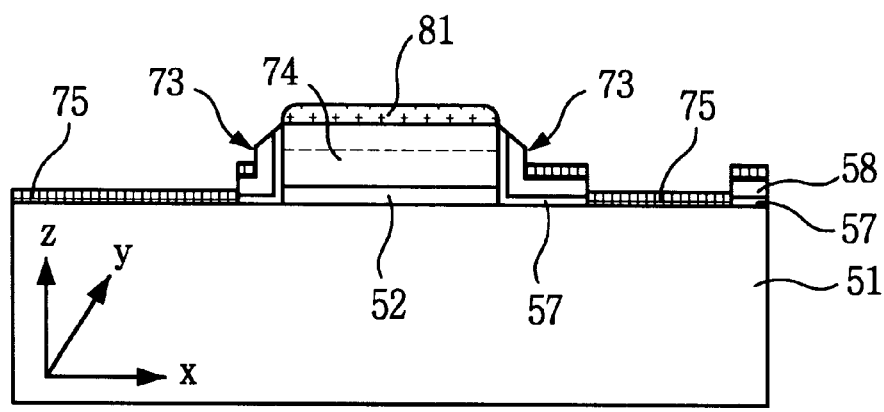
Figure 7L:
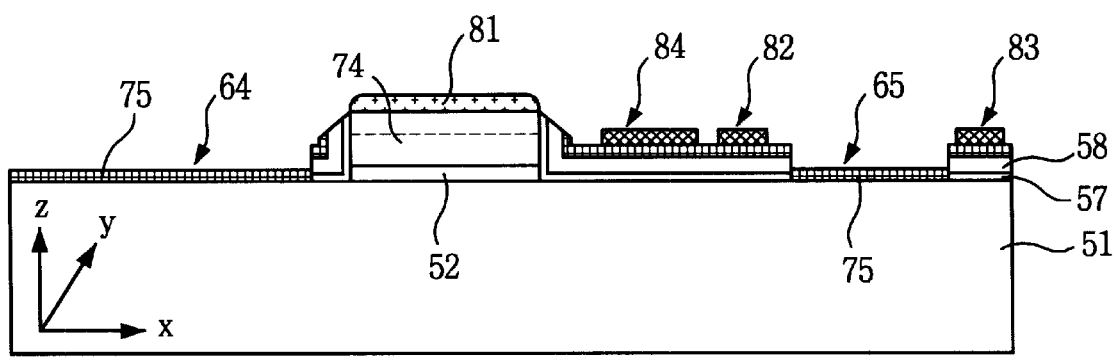
Figure 7M:
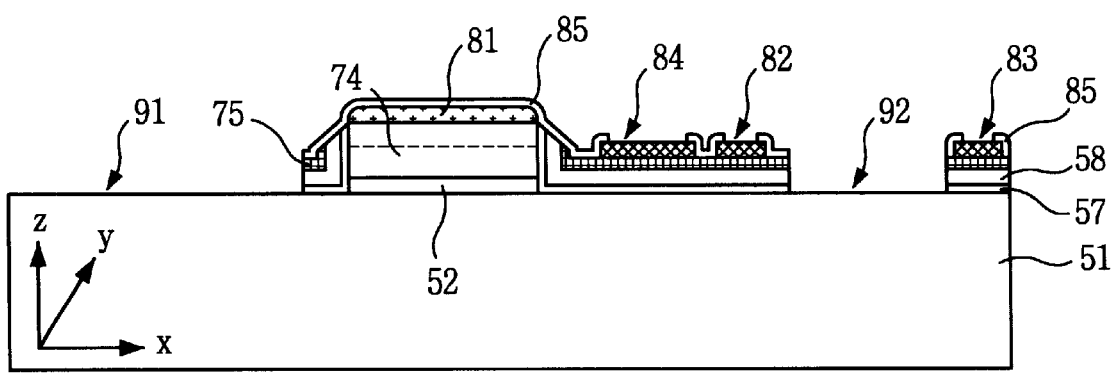
Figure 7N:
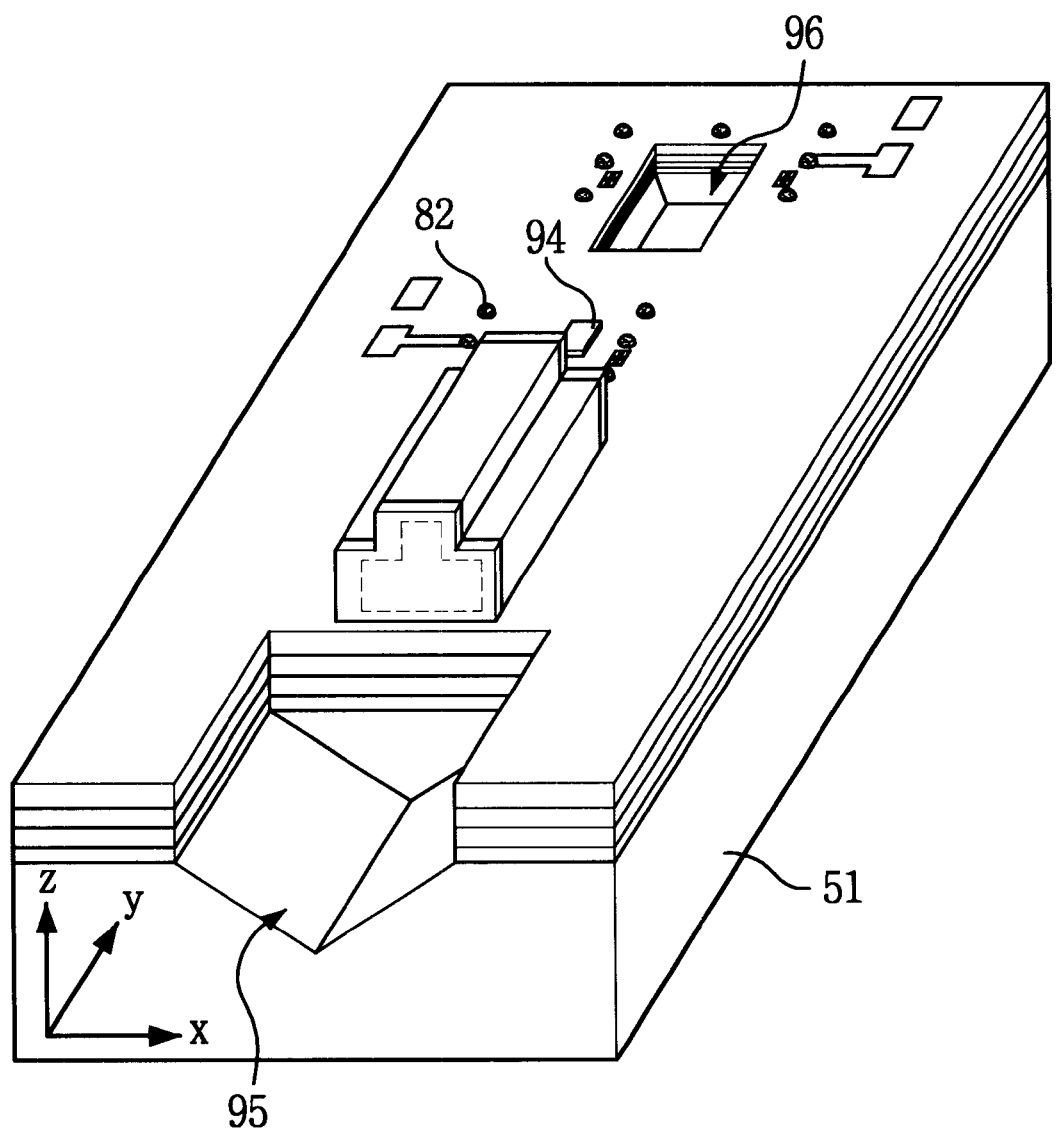
Figure 7O:
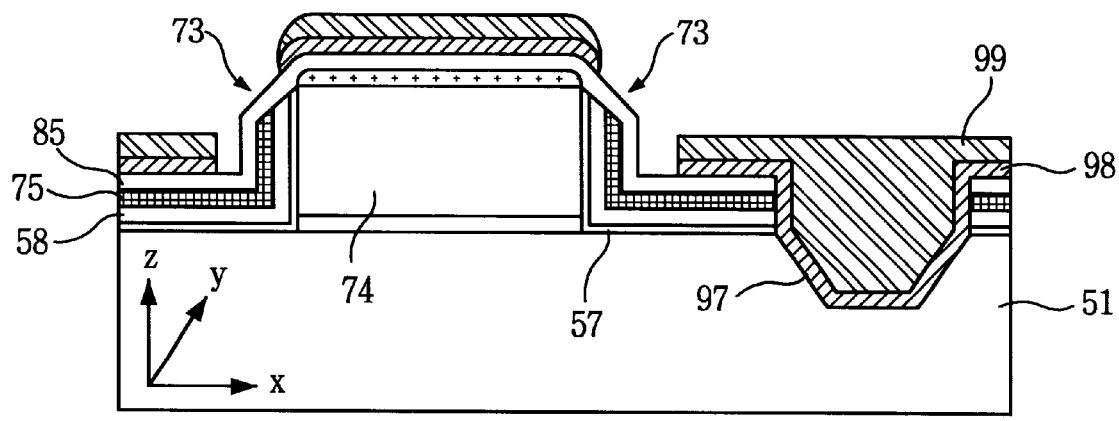
Figure 7P:
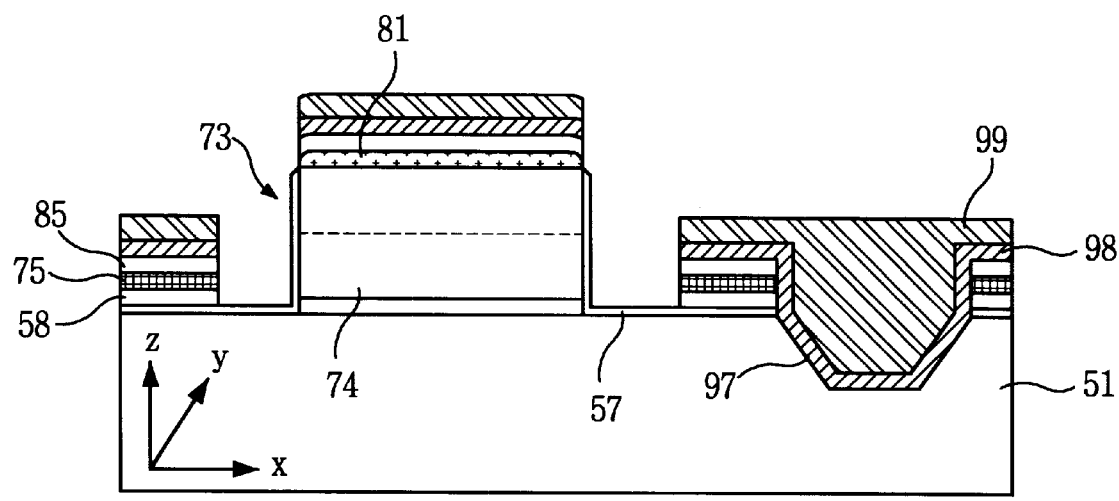
Figure 7Q:
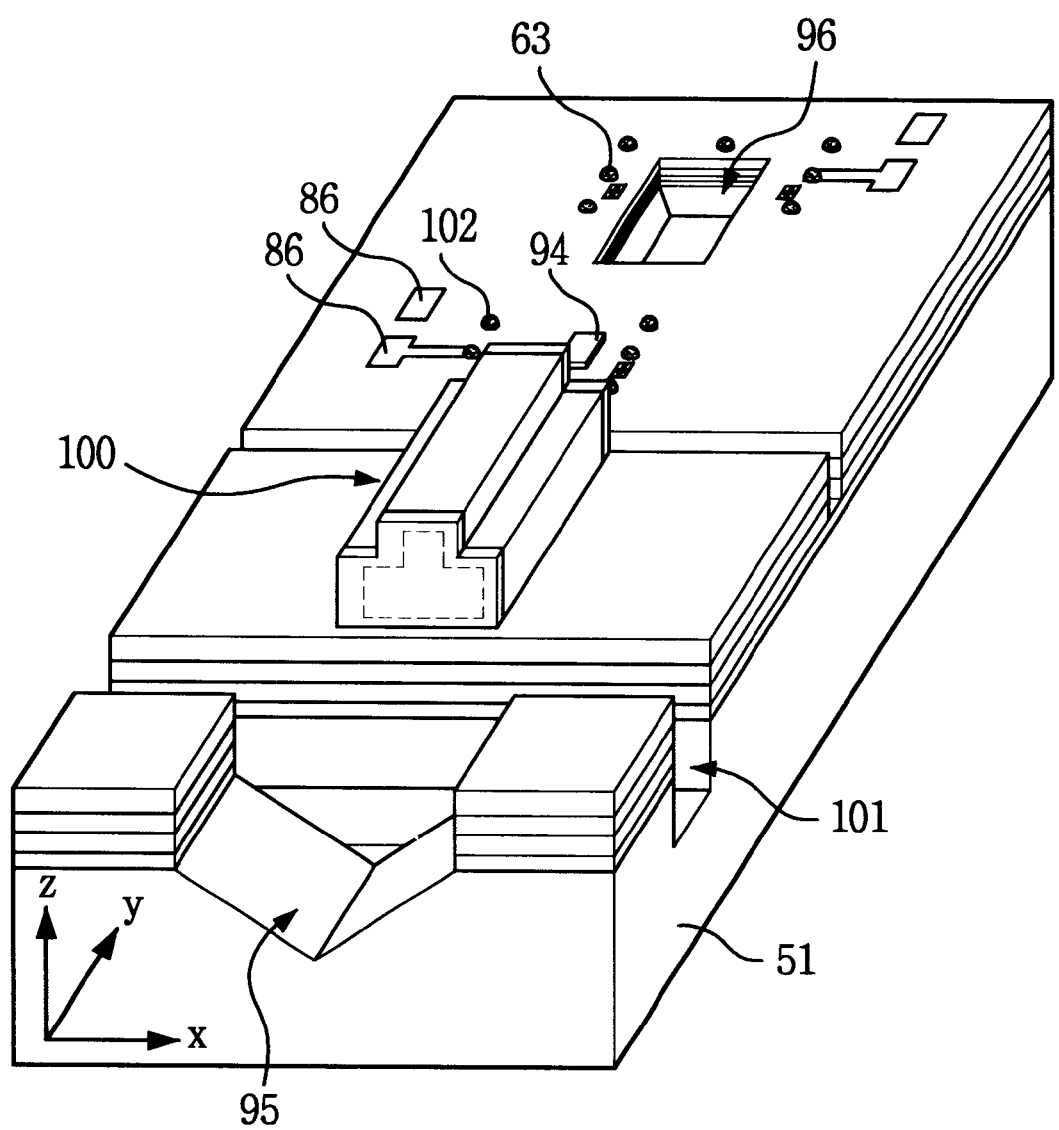

Referring now to FIGS. 7A to 7Q, there are described a method for fabricating a hybrid optical integrated circuit including a SOI waveguide, a guiding V-groove, alignment marks, and solder bumps for the flip chip bonding of the optical devices.

First, referring to FIG. 7A showing a cross-sectional view of a SOI wafer which is used as a substrate of the hybrid optical integrated circuit according to the present invention, the SOI wafer is made up of a <100> silicon substrate 51, a buffer layer 52 formed on a silicon substrate 51 and a single crystal silicon layer 53 having <100> crystalline direction.

Referring to FIG. 7B, a first etching mask layer 54, such as a silicon nitride layer or a silicon oxide layer, is formed on the whole surface of the resulting structure and an undesired portion of the first etching mask layer 54 is removed by using photolithography and plasma etching processes. The single crystal silicon layer 53 in FIG. 7A uncovered with the first etching mask layer 54 is etched by the plasma or wet etching process, thereby forming a SOI slab 55. FIG. 7C is a cross-sectional view taken along the line a–a' of FIG. B. At this time, a photoresist layer can be used as an etching mask in the dry or wet etching process for patterning the single crystal silicon layer 53.

Next, as shown in FIG. 7D, the first etching mask layer 54 and the exposed buffer layer 52 are removed by the plasma or wet etching process, or by their combination and a LPCVD silicon nitride layer 57 and a PECVD (Plasma enhanced CVD) silicon nitride 58 are, in order, formed, on the resulting structure. A material to be selectively removed by HF/H2O solution without a damage to the LPCVD silicon nitride layer 57 can be substituted for the PECVD silicon nitride 58.

Referring to FIG. 7E, a photolithography process is applied to a photoresist layer 66 for patterning and the PECVD silicon nitride 58 and the LPCVD silicon nitride 57 are selectively etched by the plasma etching using the photoresist layer 66 as an etching mask. By doing so, a SOI rib area 61, alignment marks 62 and 63 for aligning a semiconductor laser and a monitor photodetector, an fiber guiding V-groove etch window 64 and a light guiding V-groove etch window 65 are formed. The fiber guiding V-groove etch window 64 and the light guiding V-groove etch window 65 are aligned to the <110> crystalline direction of the silicon substrate 51.

The simultaneous formation of the SOI rib area 61, the alignment marks 62 and 63 for aligning the semiconductor laser and the monitor photodetector, the fiber guiding V-groove etch window 64 and the light guiding V-groove etch window 65 may reduce an error which can be caused by separate photolithography process for each pattern formation, thereby minimizing a misalignment error to be incorporated among guiding structures and increasing the optical coupling efficiency therebetween.

After removing the remaining photoresist layer 66 and depositing a new photoresist layer (not shown) on an overall surface except for the SOI slab 55, a specific areas of the SOI slab 55 except the SOI slab area 61 is etched in predetermined depth by the wet or plasma etching process using the PECVD silicon nitride 58 and the LPCVD silicon nitride 57 as an etching mask and then a rib 72 is formed as shown in FIG. 7F and the photoresist layer is removed. The depth and the width of the rib 72 is determined under the condition of satisfying the single mode in the a silicon guide layer 74 and the rib 72, thereby having a maximum efficiency in the optical coupling between devices, such as a laser, a photo-detector and an optical fiber. At the time of forming the rib 72, the protection of an overall surface except for the SOI slab 55 layer is carried out using the photoresist layer as a mask to prevent undesired areas from being exposed to an etchant, thereby exposing only the V-grooves 64 and 65 and the alignment marks 62 and 63. However, in case where the thickness of the single crystal silicon layer 53 is approximately below 10 $\mu$m, since the etching depth of the silicon layer for forming the rib 72 is at most 5 $\mu$m, the protection of the V-grooves 64 and 65, the alignment marks 62 and 63 can be neglected. In some cases, the photoresist layer for such a protection can be replace with a metal protection layer such as an aluminum layer.

Referring to FIG. 7G which is taken along the line b–b' of FIG. 7F, the LPCVD silicon nitride layer 57 may act as an anti-reflection coating layer at the end face 73 of the SOI waveguide. Accordingly, the thickness of the LPCVD silicon nitride layer 57 may be preferably controlled in order that the thickness is n$\lambda$/4 (n: integer, $\lambda$: wavelength of light within the silicon nitride layer 57). On the other hand, as shown in FIG. 7E, since the thickness of the etching mask layer, which is required to etch the SOI slab 55 except for the SOI rib area 61 with plasma, can be thicker than that of the anti-reflection coating layer, the PECVD silicon nitride 58 formed on the LPCVD silicon nitride layer 57 makes up for a deficiency of the thickness of the etching mask layer. Furthermore, as shown in FIG. 7F, the PECVD silicon nitride layer 58 also prevents the thickness of the LPCVD silicon nitride layer 57 from being thinner during the SOI slab layer 55 etching process.

To prevent an unwanted silicon oxide layer is grown on the fiber guiding V-groove etch window 64, the light guiding V-groove etch window 65 and the alignment marks 62 and 63 before forming a cladding layer of silicon oxide on the surface of the SOI waveguide, as shown in FIG. 7H (which is taken along the line c–c' of FIG. 7F), a second etching mask layer 75, such as a PECVD silicon nitride layer is formed on the whole surface of the wafer. Subsequently, the second etching mask layer 75 on a silicon guide layer 74, the PECVD silicon nitride layer 58 and the LPCVD silicon nitride layer 57 on the rib 72 are removed in order by using photolithographic process and plasma etching. FIG. 7I shows the cross-sectional view at this step.

After cleaning the wafer, a silicon oxide layer is grown by the wet or dry thermal oxidation. FIG. 7J shows a waveguide including a cladding layer 81 made of the silicon oxide layer and FIG. 7K shows a side view of FIG. 7J (which is taken along the line b–b' of FIG. 7F). Since the silicon oxide layer is not grown in case where the surface of the silicon is covered with the silicon nitride layer, the cladding layer 81 may be not grown on both of the front and rear end face of the SOI slab which is protected from the LPCVD and PECVD silicon nitride layer so that it is grown only on the surface of the guide layer 74 as shown in FIG. 7K.

Sequentially, as shown in FIG. 7L, a metal layer having a multi-layered structure, such as Ti/Ni/Au, Ti/Ni/Pt/Au or Ti/TiN/Pt/At, is patterned to be used as an under bump metal (UBM) 82, a wire bonding pad 83 to electrically connect the optical device to an external circuit, and a stand-off metal pad 84 positioned under the stand-offs 20 and 21 to adjust the height of the laser and the receiver photodetector.

Referring to FIG. 7M, a third etching mask layer 85, such as the PECVD silicon nitride or oxide layer, is deposited on the wafer and it is patterned to expose the UBM pad 82, the wire bonding pad 83 and the stand-off metal pad 84. At the same time, the third and second etching mask layers 85 and 75 within the fiber guiding V-groove etch window 64 and the light guiding V-groove etch window 65 are removed in order so that a fiber guiding V-groove etching pattern 91 and a light guiding V-groove etching pattern 92 are formed respectively. At this time, a misalignment between the fiber guiding V-groove etch window 64 and the fiber guiding V-groove etching pattern 91 can be incorporated. However, the change of the position and size of the fiber guiding V-groove etch window 64 can be prevented by forming the size of the fiber guiding V-groove etching pattern 91 and the light guiding V-groove etch window 92 larger than that of the fiber guiding V-groove etch window 64 and light guiding V-groove etch window 65 by several micron meters and controlling the etching time in the extent of the LPCVD silicon nitride layer 57 not to be etched.

Referring to FIG. 7N, a stand-off 94 is formed on the metal pad 84 (shown in FIG. 7N) in order to adjust the height of the optical device using base metal deposition and electroplating methods. Subsequently, the silicon substrate 51 is etched with an anisotropic etchant, such as KOH or EDP (ethylenediamine pyrocatechol) in the area of the fiber guiding V-groove etching pattern 91 and the light guiding V-groove etching pattern 92. As a result, an optical fiber guiding V-groove 95 and a light guiding V-groove 96 are formed.

Referring to FIG. 7O, to improve the refractivity of the sidewall of the light guiding V-groove 96 and to selectively remove the PECVD silicon nitride layer 58, the second etching mask layer 75 and the third etching mask layer 85, a fourth etching mask layer 98 is formed on the wafer using the sputtering method or the electron beam deposition method. Subsequently, the photoresist layer 99 is coated and patterned to expose the side ends 73 of the SOI waveguide and the fourth etching mask layer 98 is wet-etched using the photoresist layer 99 as an etching mask.

Referring to FIG. 7P, the third etching mask layer 85, the second etching mask layer 75 and the PECVD silicon nitride layer 58 are etched with HF/H2O solution by using the fourth etching mask layer 98 and the photoresist layer 99 as an etching mask and the photoresist layer 99 is removed. As a result, the LPCVD silicon nitride layer 57 is remained on the sidewalls of the SOI waveguide to act as an anti-reflection coating layer.

Referring to FIG. 7Q, a photoresist layer (not shown) is formed for protecting the light guiding V-groove 96 and the fourth etching mask layer 98 in FIG. 7P to be exposed is etched by the plasma or wet etching process. A solder bump 102 is formed on the UBM pattern 82 (FIG. 7N). A trench 101 is formed to a width of several tens of microns using a blind saw cut, crossing the optical fiber guiding V-groove 95 in the front of the SOI waveguide 100.

Figure 8:
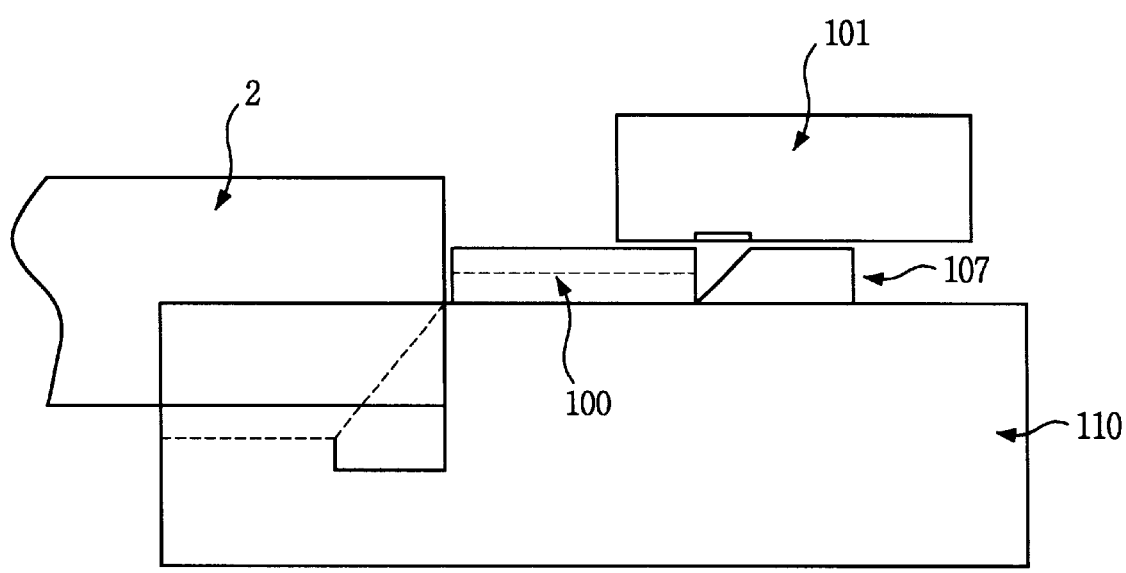
FIG. 8 is a cross-sectional view illustrating a hybrid optical integrated circuit for bi-directional communications according to another embodiment of the present invention.

FIG. 8 is a cross-sectional view illustrating a hybrid optical integrated circuit according to another embodiment of the present invention. Referring to FIG. 8, a surface light receiving type photodetector is coupled to a SOI waveguide 100 by using an optical path transformation device, whereas the waveguide type photodetector is coupled to the SOI waveguide in FIG. 7A to 7Q. That is, a micro reflection device 107 made of a silicon wafer is formed on a silicon substrate 110 and light emitted from the SOI waveguide 100, which is propagated in parallel to the silicon substrate, is reflected on the micro reflection device 107 toward a surface receiving photodetector 101 by positioning the surface receiving photodetector 101 over the micro reflection device 107. Except for the micro reflection device 107 and the surface receiving photodetector 101, the hybrid optical integrated circuit of FIG. 8 is the same as that of FIG. 7Q.

In the above mentioned embodiments, the hybrid optical integrated circuit is illustrated as to the SOI waveguide which is formed in a straight line. However, the present invention may be applicable to optical device which have active or passive optical waveguide fabricated by a Y-branch SOI waveguide or a Mach-Zehnder interferometer. Furthermore, the present invention may be applicable to all kinds of the optical waveguides having a SOI structure, such as a SOI optical switch or a SOI optical modulator.

Also, the above mentioned embodiments are illustrated as to the rib having the same width at both ends, however, the present invention can be applicable to a tapered waveguide in which the width at one end of the rib is different from that at the other end of the rib. Further, according to the present invention, it is possible to implement the hybrid optical integrated circuit having a plurality of waveguides, lasers, photodetectors, optical fibers and the like.

As apparent from the above, the present invention has the effects of minimizing horizontal misalignment between the rib waveguide area and the V-groove etch window and the alignment marks, decreasing the manufacturing cost and size by aligning the waveguide, the optical device and the optical fiber on a single substrate with passive alignment method. Also, the present invention has an effect of reducing the fresnel reflection loss by providing the LPCVD silicon nitride layer capable of being used as an anti-reflection coating layer at both ends of the waveguide.

While the present invention has been shown and described with reference to the particular embodiments, it will be apparent to those skilled in the art that many changes and modifications may be made without departing from the spirit and scope of the invention as defined in the appended claims.

What is claimed is:

1. A method for fabricating a hybrid optical integrated circuit, the method comprising the steps of:
   a) providing a SOI wafer including a silicon substrate, a buried insulating layer and a single crystal silicon layer;
   b) selectively etching the single crystal silicon layer, thereby forming a SOI slab;
   c) forming a silicon nitride layer and an etching mask layer on the resulting structure, wherein the silicon nitride layer is formed by a low pressure chemical vapor deposition process;
   d) selectively etching the etching mask layer and the silicon nitride layer to expose the single crystal silicon layer in the SOI slab except a rib area and simultaneously forming a V-groove etch window for aligning an optical fiber and marks for aligning an optical device, wherein the a rib region in the SOI slab is covered with the silicon nitride layer and the etching mask layer;
   e) selectively etching the exposed single crystal silicon layer to form a SOI rib;
   f) selectively etching the etching mask layer and the silicon nitride layer on the SOI rib;
   g) forming a cladding layer for an optical waveguide on a surface of the SOI slab and the SOI rib;
   h) anisotropically etching the silicon substrate exposed through the V-groove etch window to form an optical fiber guiding V-groove; and
   i) selectively removing the etching mask layer positioned at both end facets of the SOI slab and exposing the silicon nitride layer.

2. The method in accordance with claim 1, wherein the method further comprises the step of forming a trench crossing the optical fiber guiding V-groove, being adjacent to the SOI slab.

3. The method in accordance with claim 1, wherein the step g) further comprises the step of forming a metal pad for electrically connecting the optical device to the SOI wafer and a metal pad for solder bumps.

4. The method in accordance with claim 3, wherein the method further comprises the step of forming the solder bumps.

5. The method in accordance with claim 1, wherein the SOI slab is in a Y-branch type.

6. The method in accordance with claim 1, wherein the SOI rib is tapered.

7. The method in accordance with claim 1, wherein the silicon nitride layer is formed by a LPCVD (low pressure chemical vapor deposition) method and a thickness (t) of the silicon nitride layer is given by:

$$t = n\lambda/4 \quad (\lambda: \text{wavelength and } n: \text{integer})$$

8. The method in accordance with claim 1, wherein the cladding layer is a silicon oxide layer which is formed by a thermal oxidation.

9. The method in accordance with claim 1, wherein a ratio of a height of the SOI rib to a thickness of the single crystal silicon layer and a ratio of the height of the SOI rib to a width of the SOI rib are controlled to transmit only one fundamental mode in a vertical and horizontal direction.

10. The method in accordance with claim 1, wherein the single crystal silicon layer has a <100> direction.

11. The method in accordance with claim 10, wherein the SOI rib and the V-groove etch window are aligned in the <110> direction so that the V-groove etch window is surrounded with a surface of (111) crystalline plane.

* * * * *